(12) United States Patent
Kato

(10) Patent No.: US 6,229,730 B1
(45) Date of Patent: May 8, 2001

(54) FERROELECTRIC MEMORY DEVICE RETAINING ROM DATA

(75) Inventor: Tatsuo Kato, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/526,280

(22) Filed: Mar. 15, 2000

(30) Foreign Application Priority Data

Mar. 17, 1999 (JP) .................................................. 11-072639

(51) Int. Cl.$^7$ .................................................. G11C 11/22
(52) U.S. Cl. .......................................... 365/145; 365/149
(58) Field of Search ..................................... 365/145, 149

(56) References Cited

U.S. PATENT DOCUMENTS

| | | | |
|---|---|---|---|
| 5,086,412 | * 2/1992 | Jaffe et al. ............................ | 365/145 |
| 5,889,696 | * 3/1999 | Kawakubo et al. ................. | 365/145 |
| 5,969,979 | * 10/1999 | Hirano ................................ | 365/145 |
| 5,991,189 | * 11/1999 | Miwa .................................. | 365/145 |
| 6,016,266 | * 1/2000 | Nishimura .......................... | 365/145 |
| 6,028,782 | * 2/2000 | Hirano et al. ...................... | 365/145 |

FOREIGN PATENT DOCUMENTS 9-7378    1/1997   (JP) .

\* cited by examiner

*Primary Examiner*—Trong Phan
(74) *Attorney, Agent, or Firm*—Armstrong, Westerman, Hattori, McLeland & Naughton, LLP

(57) ABSTRACT

A ferroelectric capacitor is provided that can write ROM data at a manufacturing process, change the data after that, and restore the rewritten initial data. The ferroelectric memory device composing a memory cell, in which ferroelectric capacitors are provided, the memory cell includes ferroelectric capacitors each having a different hysteresis characteristic. The capacitor having the different hysteresis characteristic is formed at a manufacturing process as ROM data. The initial ROM data written at the manufacturing process can be restored and can be recorded as a polarizing direction by employing the difference between the hysteresis characteristics. In addition, the recorded data can be freely rewritten by a normal writing method and the recorded data can be maintained even when a power is OFF. Even after the initial ROM data is changed, the initial ROM data can be restored or recovered by employing the above-described different hysteresis characteristic.

10 Claims, 12 Drawing Sheets

2T2C Cell
according to the Present Invention

Hysteresis Curves of Capacitors
Each having a Different Dimension $$qs2+qr2 > qs1+qr1 > qs2-qr2$$

1T1C Cell
according to the Present Invention

Hysteresis Curves of Capacitors Each having a Different Dimension

Timing Chart of an Initial Data Restoring Process of 1T1C Cell
(Relating to C1)

Entire Structure of Ferroelectric Memory Device

2T2C Cell

2T2C Cell
according to the Prior Art

Hysteresis Curve of Ferroelectric Film

FIG. 11
Definition of Polarizing Direction
At the time Voltage is applied between Capacitors
At the time No Voltage is applied between Capacitors
(K)
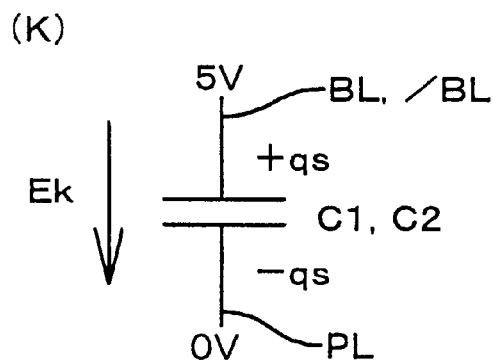
(L)
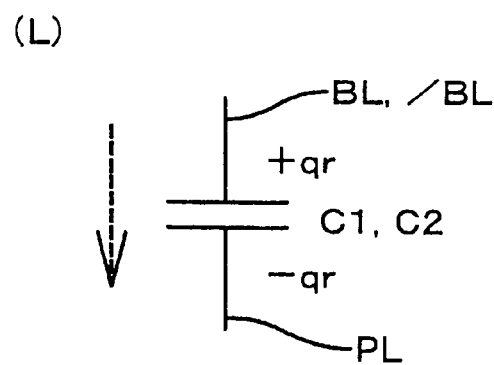
(M)
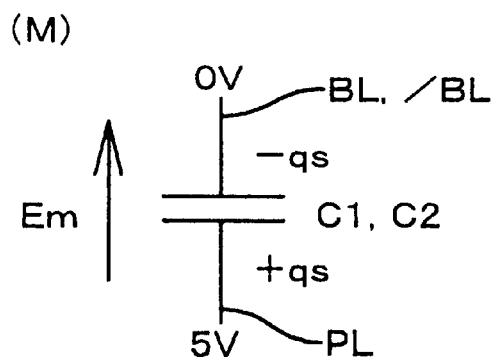
(N)
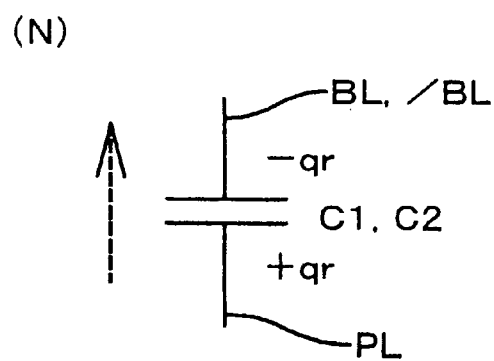

Timing Chart of Data Writing and Reading Operation of 2T2C Cell according to the Prior Art

FERROELECTRIC MEMORY DEVICE RETAINING ROM DATA

BACKGROUND OF THE INVENTION

1. Field of the Invention

The present invention relates to a ferroelectric memory device employing ferroelectric capacitors, and more particularly, to a ferroelectric memory device where ROM data stored at a manufacturing process can be retained. Especially, the ferroelectric memory device according to the present invention is more suitable a non-volatile memory provided in a micro controller, for example.

2. Description of the Related Art

In recent years, a ferroelectric memory device employing ferroelectric capacitors has been proposed as a non-volatile memory. The ferroelectric memory device stores and reads data by employing its hysteresis characteristic and residual polarization action included in a ferroelectric film of the ferroelectric capacitor. By applying an electric field to the ferroelectric capacitor in one direction, the ferroelectric capacitor becomes a polarizing state in one direction. Alternatively, by applying an electric field to the ferroelectric capacitor in the other direction, the ferroelectric capacitor becomes a polarizing state in the reversed direction. Such the polarizing state may be retained as a residual polarization even after an electric field applied to the ferroelectric capacitor is extinct. Therefore, the ferroelectric memory device is used as a non-volatile memory where data can be retained, even if a power is OFF.

FIG. 9 is a circuitry diagram of a ferroelectric memory cell according to the prior art. The structure of a memory cell MC of FIG. 9 is called a 2T2C structure, in which one pair of transistors Q1, Q2 and one pair of ferroelectric capacitors C1, C2, connected to each of the transistors are included. Each of the transistors Q1, Q2 has a gate connected to a word line WL, a source or drain electrode to which one of bit line pairs BL, /BL is respectively connected. Additionally, the ferroelectric capacitors C1, C2 are connected to a plate line PL. A sense amplifier 10 is connected to a bit line pairs BL, /BL. Data is recorded by polarizing one capacitor pair C1, C2 of the memory cell MC shown in FIG. 9, and the recorded data is read out in the later-explained method.

FIG. 10 shows a hysteresis curve of the ferroelectric film. FIG. 10 shows an applied electric field or voltage on the abscissa axis and a polarization charge on the ordinate axis. In the hysteresis curve, the polarizing state of the ferroelectric film is changed from a point K, for example, and is returned to the point K through points L, M, N.

FIG. 11 illustrates a definition of a polarizing direction of the ferroelectric capacitor in this description. In FIG. 11, each polarizing states K, L, M, N shown in FIG. 10 are shown. A hysteresis characteristic of the ferroelectric film will be now explained according to FIGS. 10 and 11.

As shown in FIG. 11, when applying a downward electric field Ek to the ferroelectric capacitors C1, C2 by applying a voltage of 5V, for example, a downward polarization charge –qs of FIG. 11 is generated on the capacitors C1, C2. When the voltage applied between the capacitors C1, C2 are removed from this state K, after that, the state is moved to the state L and the polarization charge –qs remains on the capacitors C1, C2. On the other hand, when a voltage of 5V is applied for the ferroelectric capacitors C1, C2, in the upward direction of FIG. 11, the upward electric field Em is applied and the status becomes a polarizing state M of the polarization charge +qs. Even if the voltage application to the capacitor is removed from this state M, the polarizing status of polarization charge +qs can be retained on the capacitors as the state N.

Therefore, in this description, the state K or M where the electric field or voltage is applied to the capacitors is shown by a bold arrow line, and the state L or N of residual polarization where there is no potential difference in the capacitor and the electric field is not applied is shown by a broken arrow line. The direction of arrow indicates each polarizing direction.

FIG. 12 is a timing chart of writing and reading data to the memory cell having a 2T2C structure according to the prior art. In this timing chart, a word line WL, a plate line PL, a sense amplifier operation, a bit line pairs BL, /BL, each polarizing direction of capacitors C1, C2 are shown. FIG. 12 shows the time on the abscess axis.

Data writing and reading operation modes to the memory cell of FIG. 9 will be explained in accompanying with FIGS. 10 and 12. At first, it is assumed that data written in the ferroelectric memory cell is indefinite at time Wt0 of a write cycle. The bit line pairs BL, /BL are reset to an intermediate potential between levels H and L, and the word line WL and the plate line PL are set to L level. When the word line WL is driven to H level at time Wt1, the transistors Q1, Q2 of the memory cell become conductive, and one capacitor pair C1, C2 are respectively connected to the bit line pair BL, /BL. Then, at time Wt2, the sense amplifier 10 is activated according to the written data to set the bit lines BL and /BL respectively to H and L levels. As a result, the downward electric field is applied to the ferroelectric capacitor C1 and the state becomes the state K, which is the downward polarizing state. Then, no electric field is applied to the other ferroelectric capacitor C2 so that the polarizing direction is not changed.

When the plate line PL is driven to H level at time Wt3, the capacitor C2 that is connected to the bit line /BL of L level is polarized in the other direction reversed to the capacitor C1. In other words, the capacitor C2 becomes the state M, and the capacitor C1 becomes the state L. After the plate line PL is returned to L level and the capacitor C1 is polarized again, then, the word line WL is returned to L level and the cell transistors Q1, Q2 are OFF at time Wt5. For the reason, the capacitor C becomes the downward polarizing state L, and the capacitor C2 becomes the upward polarizing state N. The polarization states are remained and are retained, even when the power is OFF.

In the reading operation mode, the bit line pair BL, /BL are pre-charged to 0V at time Rt0. When the word line WL is driven to H level at time Rt1 and the plate line PL is driven to H level, then, the state of the capacitor C1 is moved from the state L to the state M and its polarization is reversed. On the other hand, the state of the capacitor C2 is moved from the state N to the state M. As a result, the ferroelectric capacitor C1, of which polarization is reversed, emits more charge than that of the ferroelectric capacitor C2, of which polarization is not reversed, to each bit line, thus a predetermined potential difference is generated between the bit line pair BL, /BL.

At time Rt2, the plate line PL is set to L level. As a result, although the potential of the bit line pair BL, /BL is slightly pull down, the above-described potential difference can be retained. At time Rt3, the potential difference between the bit line pair BL and /BL can be detected and be amplified by activating the sense amplifier 10. As a result, the data stored in the ferroelectric capacitor can be read out through each bit line.

Since both of the capacitors C1, C2 are in the upward polarizing state at time Rt1, the stored data is broken. Therefore, the result of amplifying the sense amplifier 10 is given to the ferroelectric capacitors C1, C2 and data is rewritten by driving the plate line PL to H and L level respectively at each time Rt4 and Rt5. When the word line WL is set to L level at time Rt6, then, a residual polarizing state according to the stored data may be retained in the capacitors of the memory cell.

The above-described ferroelectric memory device is used by building in a micro controller and is used as a rewritable ROM, for example. There are some cases where a program, in which a procedure of activating the micro controller is written, because the ferroelectric memory device is nonvolatile. A CPU built in the micro controller executes required operations according to the program written in the ferroelectric memory.

However, when using the ferroelectric memory device instead of the ROM built in the conventional micro controller, the following inconvenience will be brought.

Immediately after finishing a manufacturing process, data in a memory becomes indefinite in a ferroelectric memory device. Therefore, data should be written to a memory in some kinds of methods. Although a write-only device can be used as this writing method, a special circuit such that the data transmitted from the write-only device is stored in the ferroelectric memory should be provided in a micro controller. Therefore, there is a demand that desired data can be pre-recorded at the manufacturing process like the conventional ROM.

On the other hand, once desired data is written at the manufacturing process in the conventional ROM, the data can not be rewritten after that. Therefore, when a program is recorded in a ROM of a micro controller, the program can not be changed after that. However, since the stored data can be freely changed in the ferroelectric memory device, the use of the ferroelectric memory device instead of the conventional ROM makes it possible to change the program. Conversely speaking, freely program change means that data stored at the manufacturing process may be lost, and therefore, it is also required that the lost data can be restored or recovered.

SUMMARY OF THE INVENTION

Accordingly, it is an object of the present invention to provide a ferroelectric memory device where desired data can be recorded at a manufacturing process.

It is another object of the present invention to provide a ferroelectric memory device where even when the data stored at the manufacturing process is changed after that, the initial data can be restored or recovered as needs.

To achieve the above-described objects, in a ferroelectric memory device according to the present invention comprising a memory cell having ferroelectric capacitors, the memory cell includes ferroelectric capacitors each having a different hysteresis characteristic. The capacitor having the different hysteresis characteristic as ROM data is formed in the manufacturing process. Then, the difference of the hysteresis characteristics is used to restore the original ROM data written in the manufacturing process and to record the data in a polarized direction. Further, the recorded data can be freely changed by a normal writing method, and the recorded data can be retained even after a power is OFF. Even after first ROM data is changed, the original ROM data can be restored or recovered by employing the above-described hysteresis characteristic.

To achieve the above-described objects, in a ferroelectric memory device according to the present invention including plural memory cells located at intersections between plural bit and word lines, each of the plural memory cells includes a first memory cell which includes a ferroelectric capacitor having first hysteresis characteristic and a second memory cell which includes a ferroelectric capacitor having second hysteresis characteristic.

Additionally, in the above-described invention, the first hysteresis characteristic includes first polarization change to a change of predetermined voltage or electric field applied to the ferroelectric capacitor, and the second hysteresis characteristic includes a second polarization change more than the first polarization change to the change of the predetermined voltage or electric field change.

Additionally, in the above-described invention, the capacity of the ferroelectric capacitor having the first hysteresis characteristic is smaller than that of the ferroelectric capacitor having the second hysteresis characteristic. Considering more concrete structure, the ferroelectric capacitor having the first hysteresis character has a smaller dimension and more film thickness than that of the ferroelectric capacitor having the second hysteresis character.

According to the present invention, ROM data can be written by forming the ferroelectric capacitors each having different hysteresis characteristic in a manufacturing process, according to initial data (ROM data). The difference of the hysteresis characteristics can be restored by using the amount of changes of the polarization charges of the capacitors, which occurs when the first voltage or electric field is changed to the second voltage or electric field in the ferroelectric capacitor. A memory cell having 1T1C structure or 2T2C structure can be applied to the present invention.

BRIEF DESCRIPTION OF THE PRESENT INVENTION

FIG. 11 is a diagram showing a definition of a polarizing direction of the ferroelectric capacitor in this specification.

DESCRIPTION OF THE PREFERRED EMBODIMENTS

Hereinafter, preferred embodiments of the present invention are described with reference to the drawings. However, the technical scope of the present invention is not limited to these embodiments.

Figure 1:
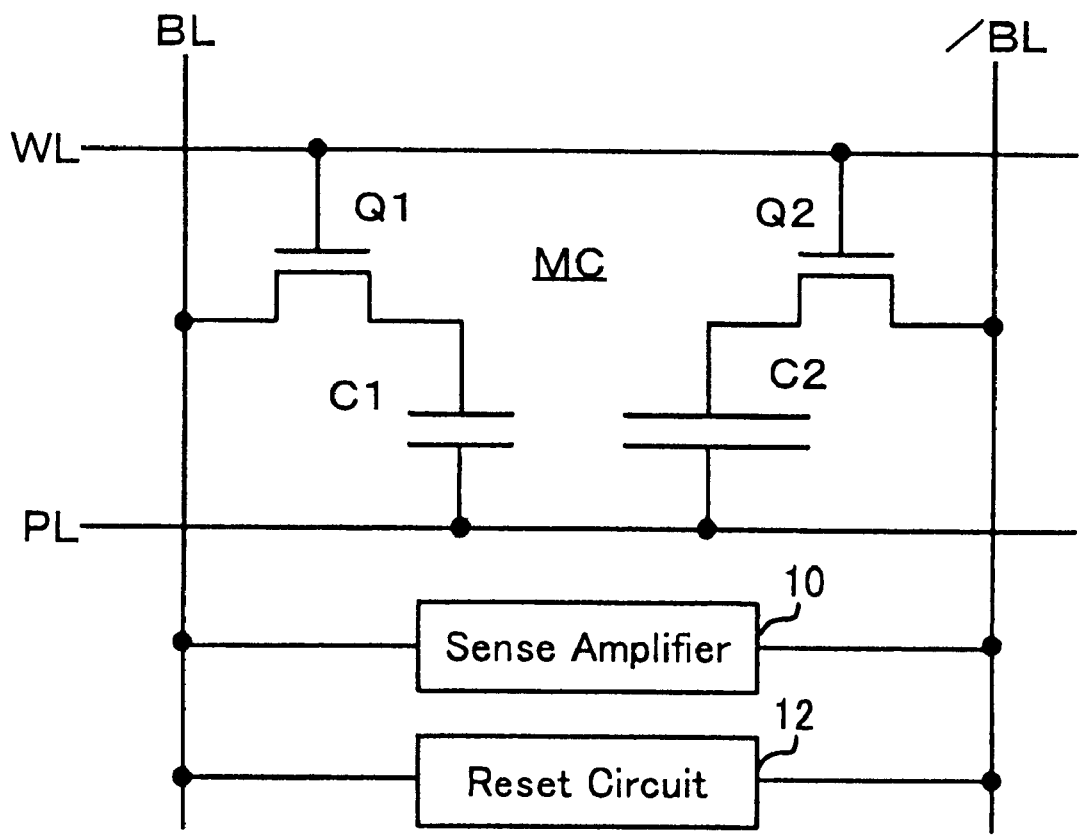
FIG. 1 shows a ferroelectric memory cell having a 2T2C structure according to the present embodiment.
Figure 9:
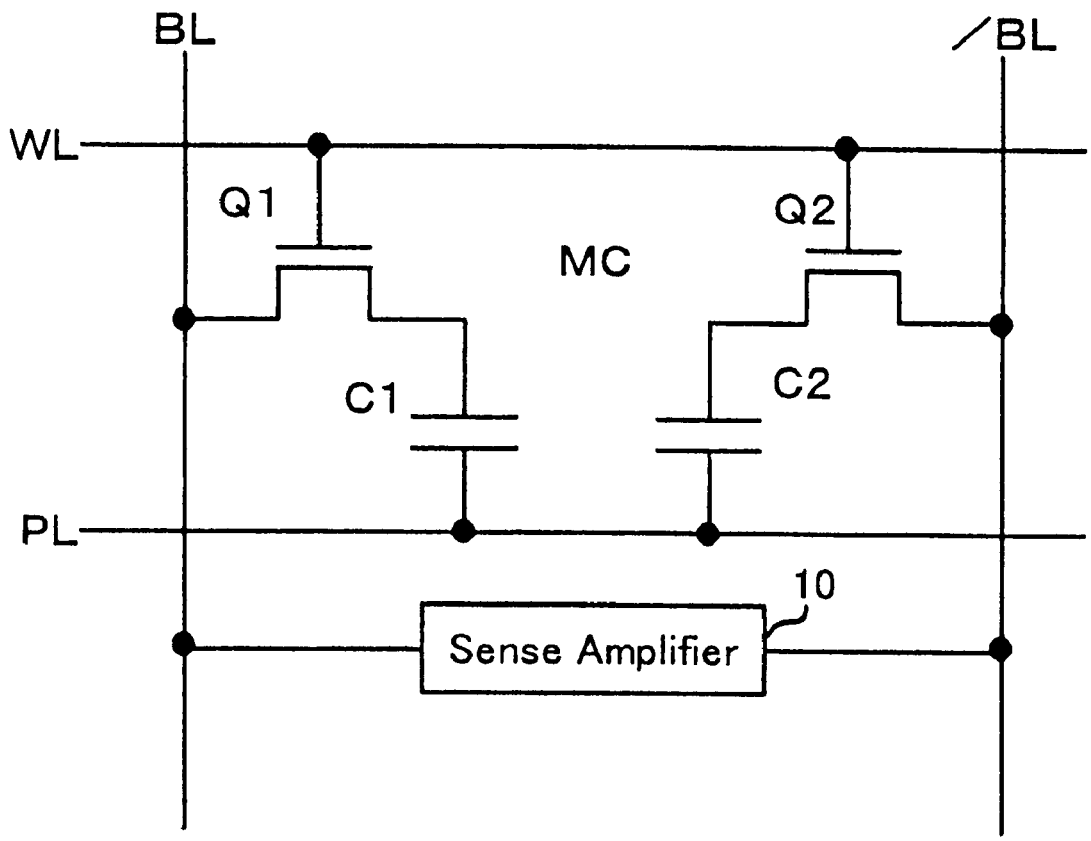
FIG. 9 is a circuitry diagram of the ferroelectric memory cell in the prior art.
Figure 10:
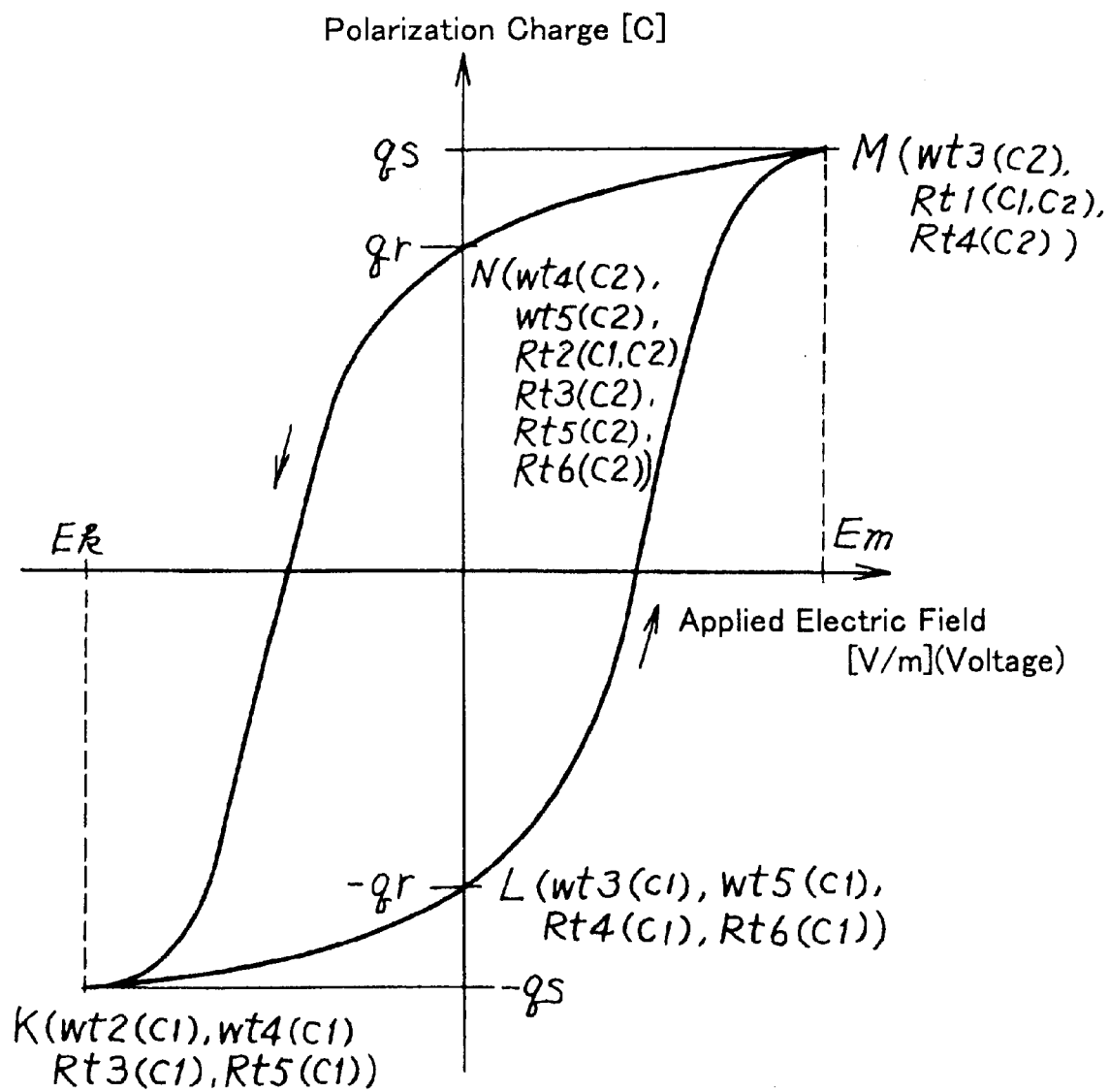
FIG. 10 is a diagram showing a hysteresis curve of the ferroelectric film.
Figure 12:
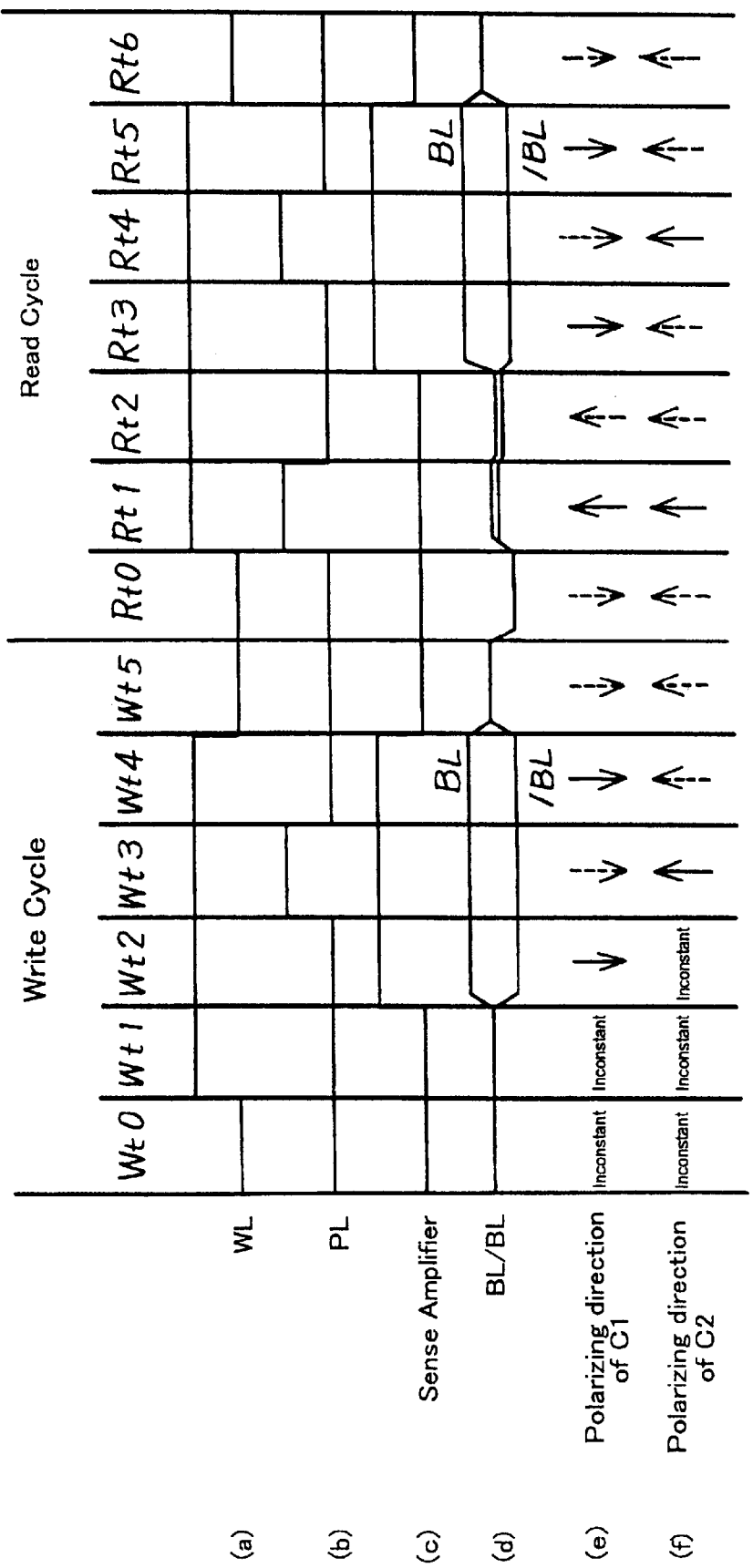
FIG. 12 is a timing chart of writing and reading data in the 2T2C-formed memory cell in the prior art.

FIG. 1 is a ferroelectric memory cell having a 2T2C structure according to the present invention. Similarly to the prior art shown in FIG. 9, there is provided a bit line pair BL, /BL, and a word line WL and a plate line PL intersecting thereto and a memory cell MC including one transistor pair Q1, Q2 and one ferroelectric capacitor pair C1, C2, is located at the intersection of the bit line pair BL, /BL, the word line WL and the plate line PL. In this embodiment, at the manufacturing process, the dimension of the ferroelectric capacitor C2 is formed to be larger than that of the capacitor C1 and the capacity of the capacitor C2 is formed to be larger than that of the capacitor C1. A sense amplifier 10 and a reset circuit 12 are connected to the bit line pair BL, /BL. The sense amplifier 10 drives the bit line pair according to the written data at data writing time, and detects and amplifies a very small potential difference formed on the bit line pair at data reading time, similarly to the prior art. Further, the reset circuit 12 resets bit line pair respectively to H level to read the initial data recorded at the manufacturing process.

Figure 2:
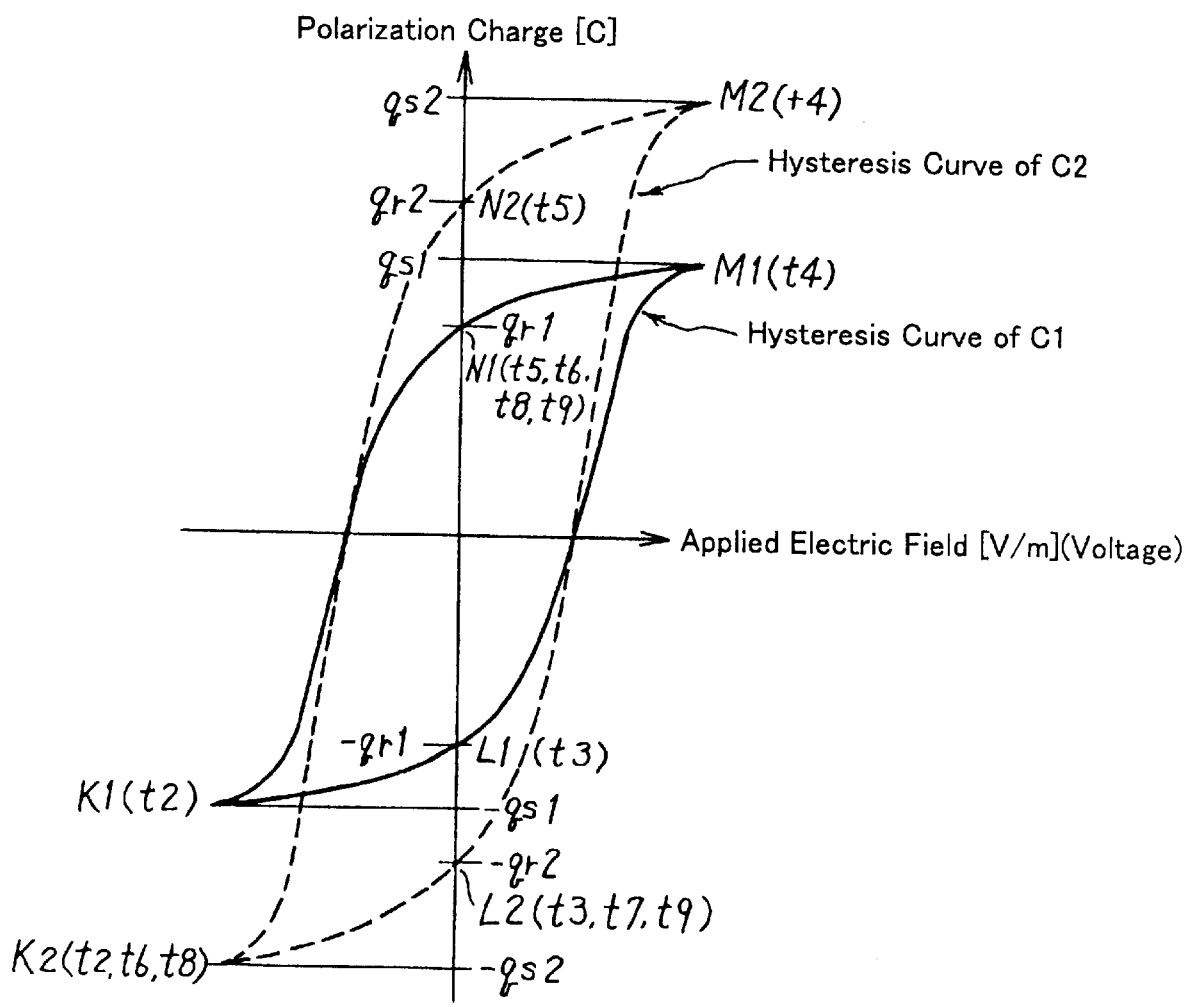
FIG. 2 is a diagram showing a hysteresis curve of capacitor having a different dimension.

FIG. 2 is a diagram showing hysteresis curves of capacitors each having a different dimension. As shown in FIG. 1, the dimension of the ferroelectric capacitor C1 is larger than that of the other ferroelectric capacitor C2. In this way, the state where the dimension of the capacitor C2 is larger than that of the capacitor C1 means a ROM data (initial data) "0". Therefore, the case where the dimension of the capacitor C1 is larger than that of the capacitor C2 means ROM data "1".

As shown in FIG. 2, the hysteresis curve of the capacitor C1 having a smaller dimension has a smaller polarization charge changes to a charge of a constant electric field or voltage, as illustrated by a bold line. Additionally, the hysteresis curve of the capacitor 2 having a larger dimension has a larger polarization charge changes to the charge of the constant electric field or voltage, illustrated by a broken line of FIG. 2. In this embodiment, ROM data stored at the manufacturing process can be read out and be reproduced and rewritten in the memory cell by employing the difference of each hysteresis curves. Therefore, there is no need to provide a special writing circuit in a micro controller, as described in the prior art.

Figure 3:
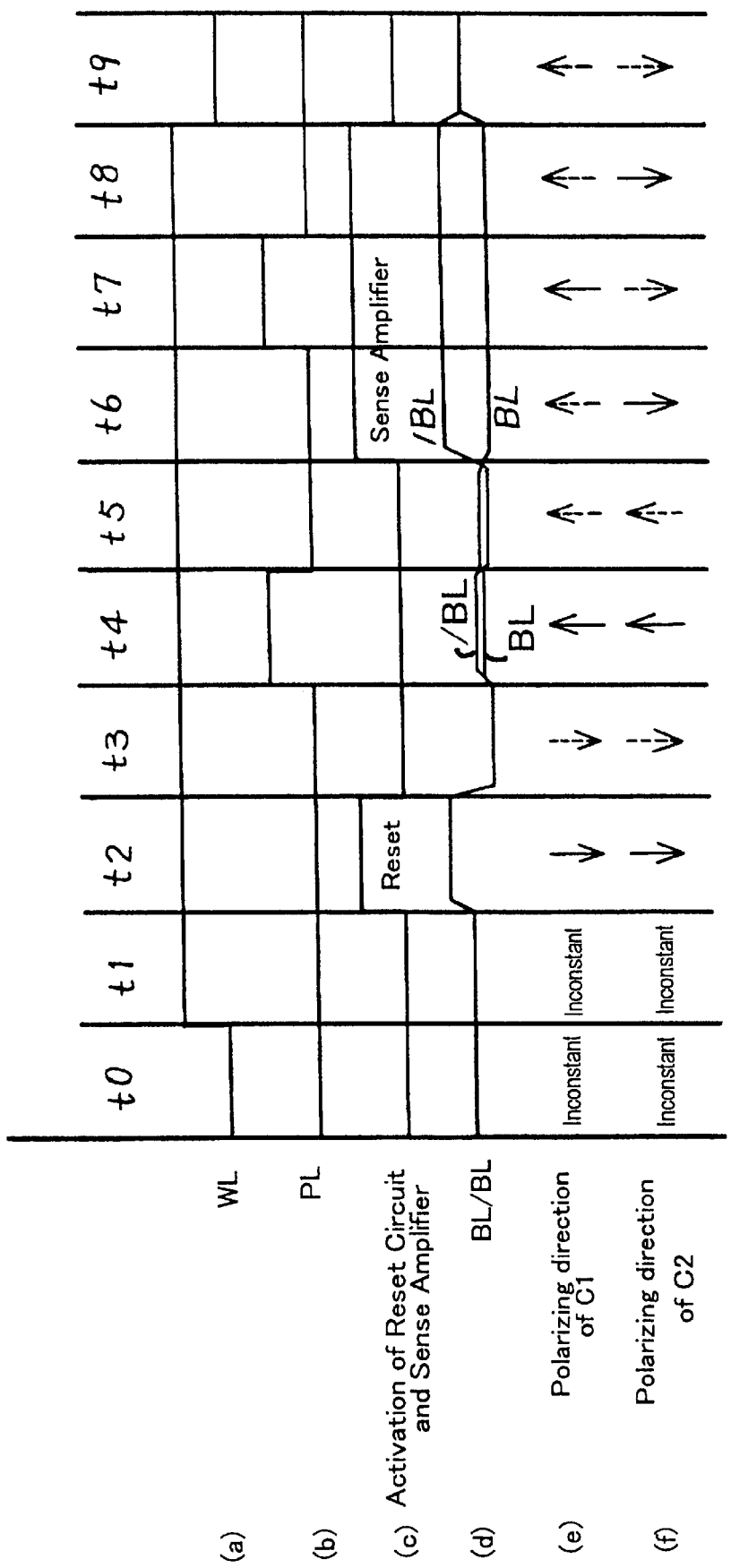
FIG. 3 is a timing chart of a process of restoring initial data (ROM data) of a 2T2C-formed cell according to the present invention.

FIG. 3 is a timing chart of a process of restoring initial data (ROM data) of a 2T2C-formed cell according to the present invention. Each time t0 to t9 shown in FIG. 3 are illustrated in each status K, L, M, N of FIG. 2. The process of restoring ROM data will be now explained in accompanying with FIGS. 2 and 3.

The polarizing directions of ferroelectric capacitors C1, C2 are indefinite at time t0 immediately after the manufacturing process has been finished. The bit line pair BL, /BL are set to a predetermined intermediate potential, and the plate line PL is reset to L level at time t0. Then, the word line WL is driven to H level so that the bit line pair BL, /BL are connected to respective ferroelectric capacitors C1, C2 at time t1.

The reset circuit 12 is driven to drive the bit line pair BL, /BL to H level at time t2. As a result, an electric field or voltage in the plate line direction (downward direction) is applied to both of the capacitors C1, C2, and then, both of the capacitors C1, C2 become the downward polarizing state. That is, the capacitors respectively become states K1 and K2 of FIG. 2. The reset circuit 12 pre-charges the bit line pairs BL, /BL to L level at time t3. Although the potential difference between both capacitors is removed, then, a residual polarizing state is retained as illustrated by a downward broken arrow of FIG. 3. In other words, both of the capacitors become the states L1 and L2 of FIG. 2.

When the plate line PL is driven to H level at time t4, then, reversal of polarity occurs for the capacitors C1 and C2. Specifically, the state of the capacitor C1 is moved from the state L1 to the state M1 and the state of the capacitor C2 is moved from the state L2 to the state M2 in FIG. 2. As a result, the capacitor C2, of which hysteresis curve is larger, discharges more charges than the capacitor C1, of which hysteresis curve is smaller, to the bit lines. AS shown in time t4 of FIG. 3, therefore, the potential of bit line /BL becomes higher than that of the bit line BL.

When the plate line PL is reset to L level at time t5, the potential of the bit line pair is slightly lowered, but the relationship of the potential difference is retained. In this status, the capacitors respectively become the states N1 and N2 of FIG. 2. When the sense amplifier 10 is activated to detect and amplify a minute potential difference appeared on the bit line pair, then, the bit line /BL is driven to H level and the bit line BL is driven to L level.

In this status, according to H level of the plate line PL at time t7 and L level of the plate line PL at time t8, the data generated on the bit line pair is given to the ferroelectric capacitors C1 and C2 of the memory cell and the initial data (ROM data) is written in the capacitor of the memory cell by a normal rewriting principle, similarly to the prior art. Even when the word line WL is reset to L level at time t9, the polarizing state of the capacitors, to which the data is written, can be retained.

As is apparent from the above-described explanation, ROM data corresponding to each dimension size of the capacitors, to which the data is written at the manufacturing process, is read out to the bit line pair from the time t1 to the time t6. The ROM data is written from the bit line pair to the memory cell by operations from the time t6 to the time t9. In this way, a desired data can be rewritten, similarly to the conventionally used ROM by changing the hysteresis curve of the capacitor in the memory cell at the manufacturing process. Additionally, the written ROM data can be read out by the operations indicated from the time t0 to the time t6, and the data is written to the memory cell from the time t6 to the time t9. Therefore, there is no need to use a special writing device, and the ROM data (initial data) written at the manufacturing process can be written as the polarizing state in the ferroelectric memory cell.

In the memory cell MC shown in FIG. 1, the sense amplifier 10 drives the bit line pair according to a written data so that any write data can be written and can be read out by a normal reading operation. In other words, certain data different from the initial ROM data recorded at the manufacturing process can be written to the memory cell later on. Additionally, the initial ROM data written at the manufacturing process can be restored to the memory cell by executing the initial data restoring process shown in FIG. 3, again.

As described above, when restoring the initial ROM data, since the amount of polarization charge (qs2+qr2) given by the capacitor C2, of which hysteresis curve is larger, becomes larger than the amount of polarization charge (qs1+qr1) given by the capacitor C1, of which hysteresis curve is smaller, a very minute potential difference can be generated between the bit line pair. Additionally, a normal reading operation requires that the amount of the polarization charge (qs1+qr1) when the capacitor C1 is changed from the state L1 to the state M1 is larger than the amount of polarization charge (qs2−qr2) when the reversed polarizing state of capacitor C2 is changed from the state N2 to M2. Initial data is written at the manufacturing process so as to have a hysteresis curve that fulfills the above condition.

The desired data can be written at the manufacturing process, similarly to the conventional program ROM, by building the ferroelectric memory as a program recording memory in a micro controller and the data can be rewritten after the manufacturing process has been finished. Therefore, when using as the program ROM built in the micro controller, the program can be corrected and be changed, and the original initial data can be simply restored, when the program is changed by mistake.

Figure 4:
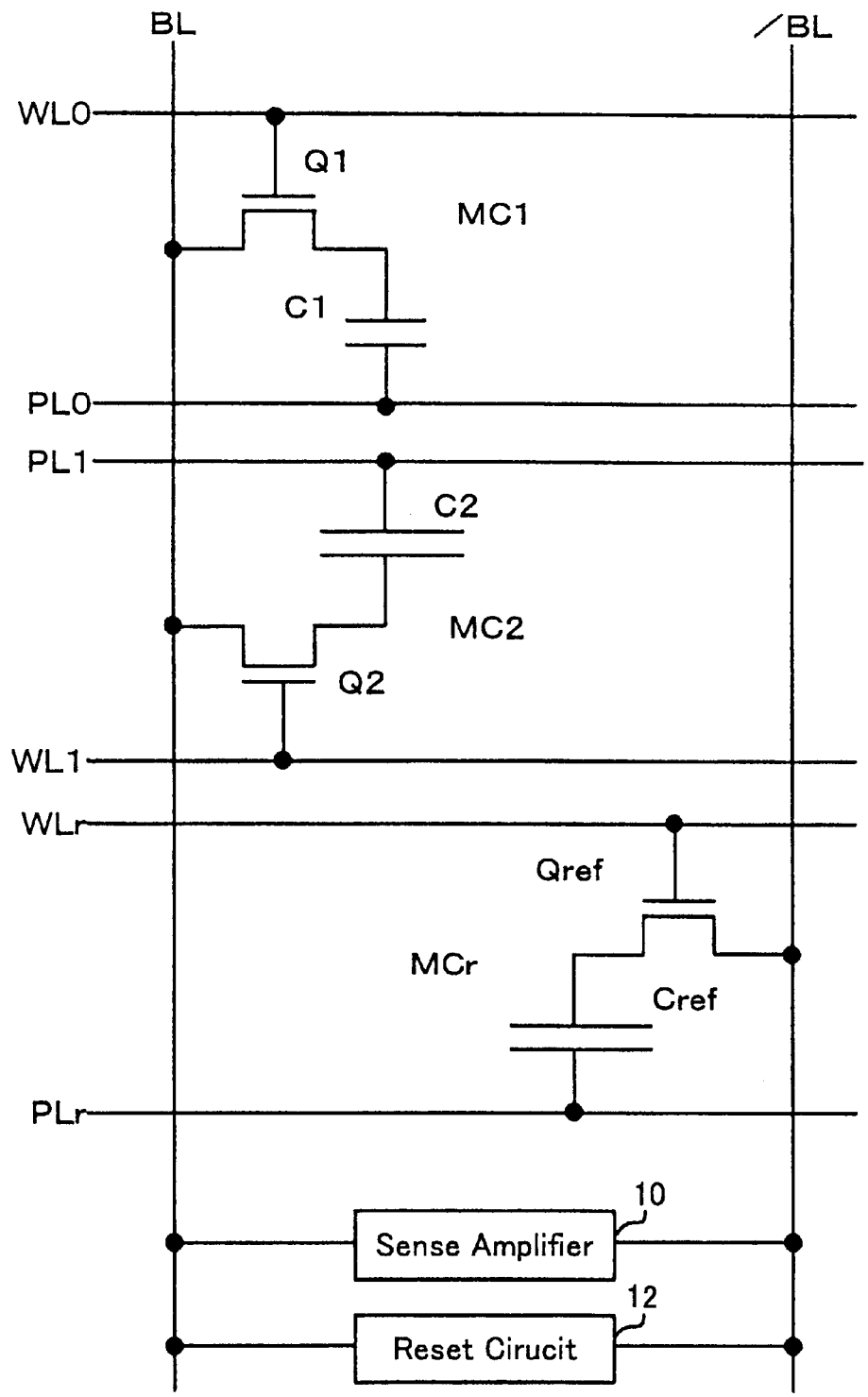
FIG. 4 is a circuitry diagram of a memory cell having a 1T1C structure (having one transistor and one capacitor) according to the present invention.

FIG. 4 is a circuitry diagram of the memory cell composed by one transistor and one capacitor (having the 1T1C structure) according to the present embodiment. In FIG. 4, three sets of word and plate lines are intersected to the bit line pair BL, /BL. WL0, WL1 are normal word lines and WLr is a word line for reference. Similarly, PL0, PL1 are normal plate lines and PLr is a plate line for reference. In FIG. 4, normal memory cells MC1, MC2 are respectively connected to one bit line BL side. In opposite, a memory cell MCr for reference is connected to the other bit line /BL side. One transistor Q and one ferroelectric capacitor C are provided to each memory cell.

In this embodiment, the dimension of ferroelectric capacitor C1 of the memory cell MC1 is smaller than that of the ferroelectric capacitor C2 of the memory cell MC2. In addition, the ferroelectric capacitor Cref of the memory cell MCr for reference has the dimension intermediate between those of the capacitors C1, C2. Specifically, the dimension becomes larger in an order of the capacitors C1, Cref and C2 and the capacity of the capacitor also becomes larger in that order.

Figure 5:
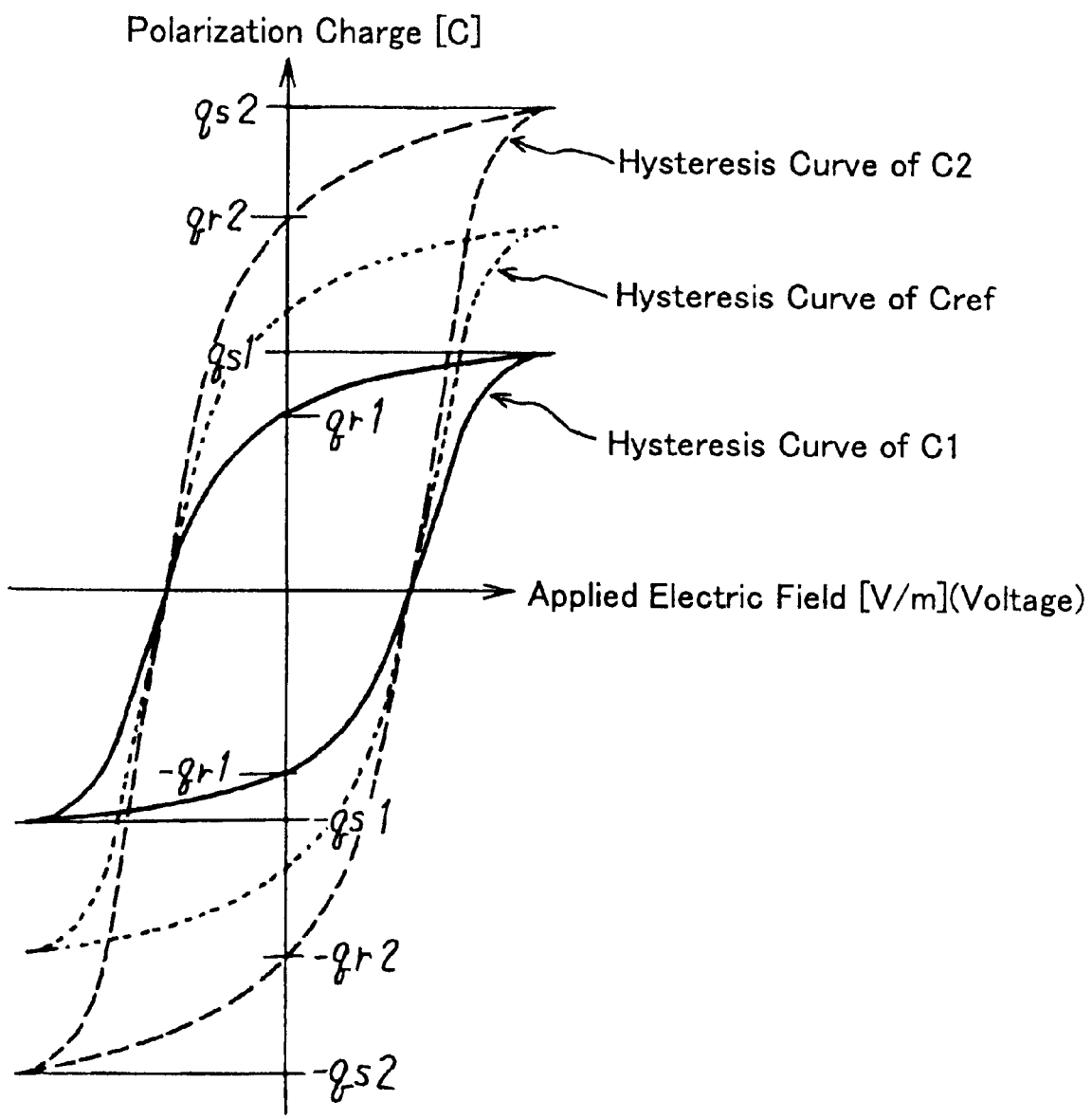
FIG. 5 is a diagram showing a hysteresis curve of capacitors having a different dimension.

FIG. 5 is a diagram showing hysteresis curves of capacitors each having a different dimension. As described above in FIG. 4, the dimension becomes larger in the order of the capacitors C1, Cref and C2 so that each hysteresis curve of capacitor becomes larger in the same order.

When reading the memory cell MC1 in a memory cell array having the 1T1C structure of FIG. 4, the memory cell MCr for reference is employed. When reading the memory cell MC2, the memory cell MCr for reference is similarly employed. Specifically, when employing the 1T1C memory cell array, each memory cell is composed by one transistor and one ferroelectric capacitor, and one memory cell MCr for reference connected to the other bit line /BL is shared by plural memory cells connected to the same bit line BL. Therefore, the numbers of elements of one memory cell can be decreased and the capacity of the memory can be increased.

As is apparent from the above-described principle, when initial data (ROM data) is restored in and read out from the memory cell MC1, the hysteresis curves of capacitors C1 and Cref shown in FIG. 5 are employed. This formation is the same as the case of the 2T2C formed memory cell shown in FIG. 1. On the other hand, when initial data (ROM data) is restored in or read out from the memory cell MC2, the hysteresis curves of the capacitors Cref and C2 of FIG. 5 are employed, similarly to the case of FIG. 2.

Figure 6:
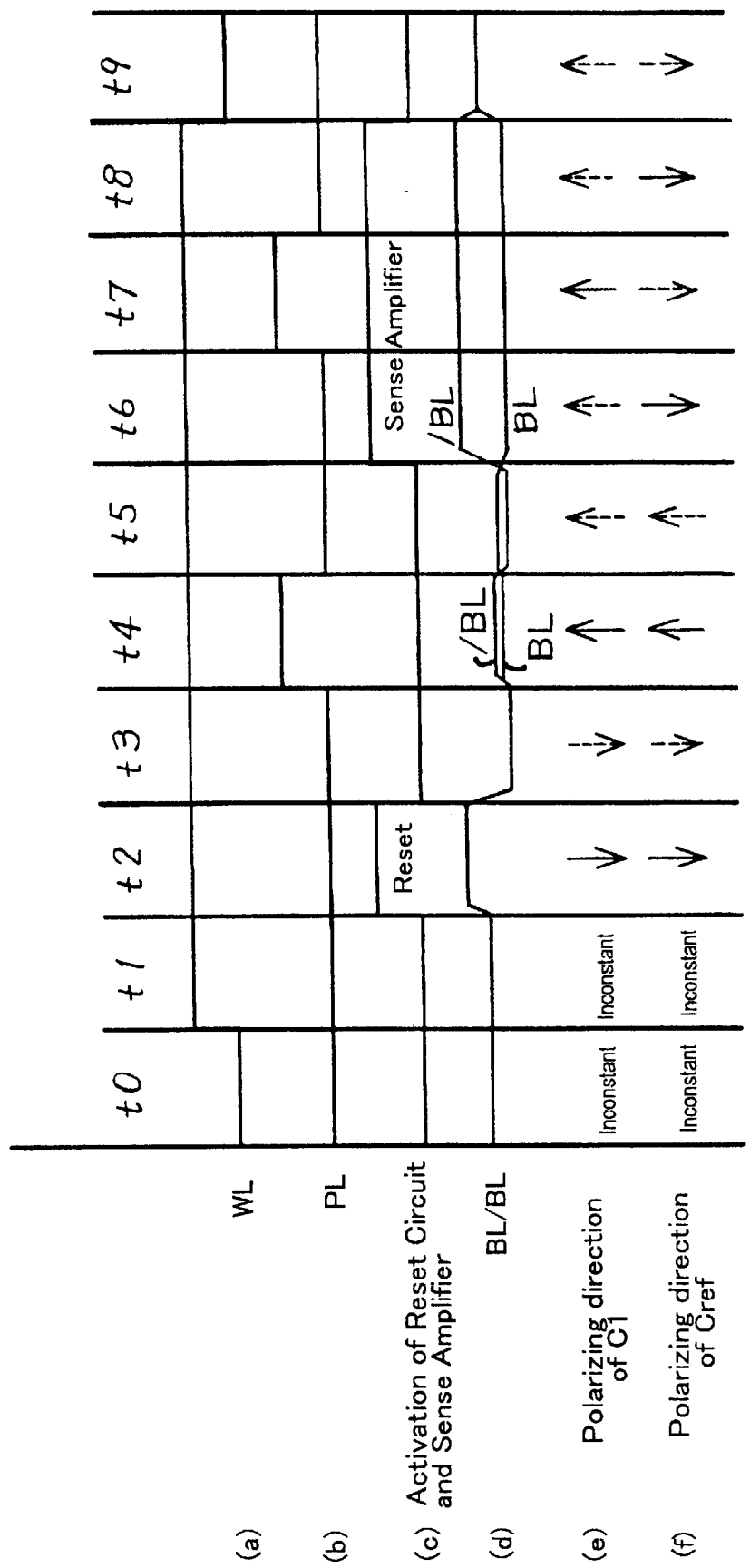
FIG. 6 is a timing chart of a process of restoring initial data in a 1T1C-formed cell according to the present invention.

FIG. 6 is a timing chart of an initial data restoring process in the 1T1C memory cell array according to the present embodiment. This timing chart illustrates the case where initial data is restored in the memory cell MC1. The timing chart of FIG. 6 is approximately the same as that of FIG. 3. The different point is that polarizing directions of capacitors C1 and Cref are illustrated, and word and plate lines WL0 and PL0 for the memory cell MC1 and word and plate lines WLr and PLr for reference are also illustrated. The other parts are the same as those of the timing chart of FIG. 3.

Specifically, when employing the 1T1C memory cell, initial data is read out from time t0 to time t6, and the initial data read out from time t0 to time t6 is recorded in the memory cell as a polarizing state. Similarly to the case of FIG. 3, the word line is driven to H level at time t1, and the reset circuit 12 drives both of the bit line pair BL, /BL to H level at time t2. As a result, the downward polarization occurs on the capacitors C1, Cref. After the reset circuit 12 pre-charges both of the bit line pair to L level at time t3, the plate lines PL0 and PLr are driven to H level at time t4. Then, the different amount of charges flow to the bit line pair, according to the different sizes of the hysteresis curves of both capacitors. In the example of FIG. 6, more charge is flowed to the bit line /BL, and less charge is flowed to the bit line BL, thus a minute potential difference occurs on the bit line pair.

The minute potential difference of the bit line pair that occurs in that way is detected and amplified by activating the sense amplifier 10 at time t6. As a result, the bit line pair /BL and BL are respectively driven to H level and L level, and then, the initial data is read out to the bit line pair. After that, each plate line is respectively driven to H level at time t7 and an upward polarizing state is generated on the capacitor C1. The plate lines are respectively driven to L level at time t8 and a downward polarizing state is generated on the capacitor Cref for reference. Then, the word line is reset to L level at time t9 and the residual polarizing states are recorded in the memory cells.

Since only the capacitor C1 is provided on the memory cell MC1 when employing the 1T1C memory cell shown in FIG. 4, there is no necessity for generating polarization for the capacitor Cref for reference at time t8.

As is explained above, initial data (ROM data) recorded at the manufacturing process can be restored even by using the memory cell structure having one transistor and one ferroelectric capacitor, data stored in the memory cell can be rewritten as need after that, and the initial data (ROM data) can be restored, when the data is rewritten by mistake.

Figure 7:
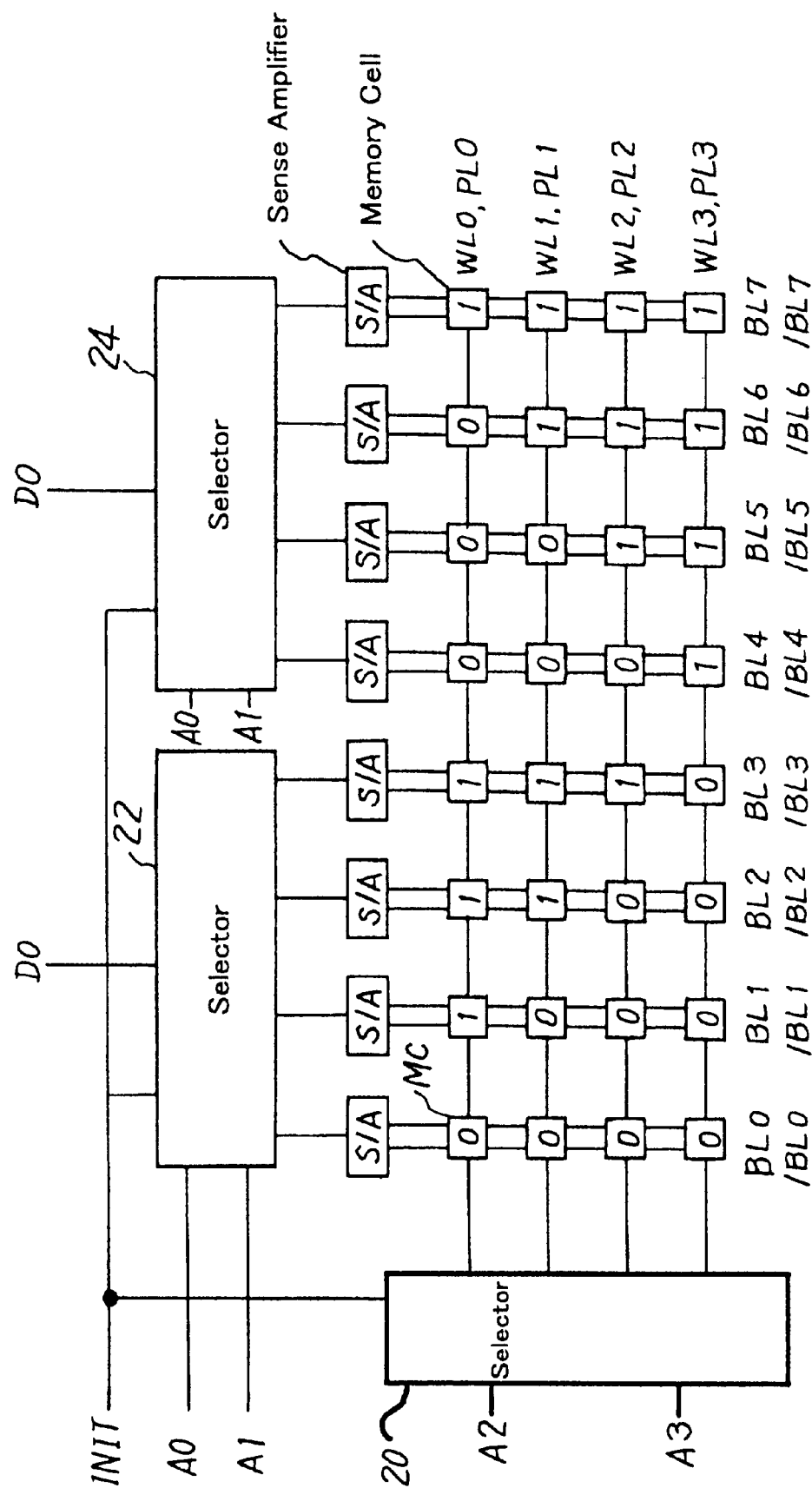
FIG. 7 shows an entire structure of the ferroelectric memory device according to the present invention.

FIG. 7 shows an entire structure of the ferroelectric memory device according to the present embodiment. The memory device has memory cells MC each having four rows and eight columns, to which word and plate lines WL and PL, and bit line pair BL, /BL are connected. A sense amplifier S/A is connected to each of the bit line pair. Address signals A0, A1 are respectively given to column selectors 22, 24, and address signals A2, A3 are given to a row selector 20. Initial data (ROM data) of "0" or "1" shown in FIG. 7 is written to each memory cell at the manufacturing process.

A case of restoring the above-described initial data in the ferroelectric memory device shown in FIG. 7 will be now explained. At first, it will be explained in reference to the interval between time t0 and t9 of the timing chart shown in FIGS. 3 and 6. The row selector 20 drives the word line WL0 and the plate line PL0 on the first row by respectively setting the addresses A2, A3 to 0. As a result, the initial data can be restored all for eight memory cells MC on the first row. Next, the initial data can be restored all for eight memory cells on the second row by changing the addresses A2, A3. In the same way, the initial data can be restored all for the memory cells on the third and fourth rows. Therefore, it becomes clear that the initial data (ROM data) written at the manufacturing process can be restored all for the plural memory cells on the same row by driving the word and plate lines so that it takes few time to execute a process of restoring the initial data.

Figure 8:
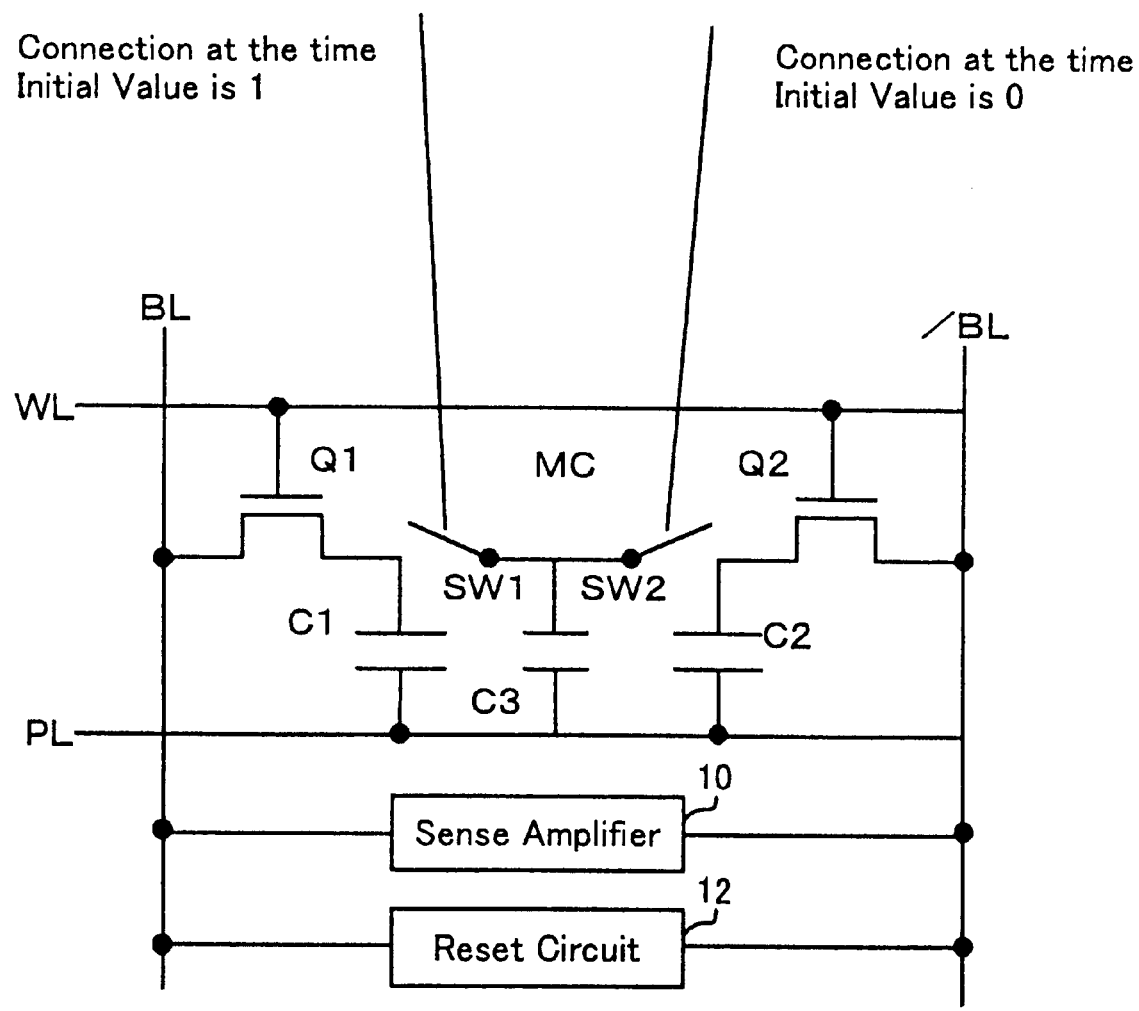
FIG. 8 is an explanatory diagram of writing initial data of the 2T2C-formed memory cell according to the present invention.

FIG. 8 is an explanatory diagram of writing initial data of the 2T2C formed memory cell according to the present embodiment. The dimension of the capacitor C1 or C2 can be larger or smaller by connecting or disconnecting a switch SW1 or SW2 at the manufacturing process. The initial data can be written in relation to the switches SW1, SW2 by using mask data showing whether or not a via hole is formed, for example. Alternatively, the switches SW1 and SW2 are formed by fuses in order to write the initial data by cutting one fuse.

When one transistor and one capacitor form the memory cell, the initial data can be written by connecting or not connecting an additional capacitor in parallel.

In the above-described embodiments, the initial data (ROM data) can be written by changing the dimension of each capacitor of a memory cell to give a different hysteresis characteristic. The present invention is not restrict to that, but more larger hysteresis characteristic can be given by thinning the thickness of the ferroelectric capacitor of the memory cell to make the capacity increase. Alternatively, the material of the ferroelectric capacitor is changed to make the hysteresis curve larger or smaller to record the initial data (ROM data).

As is explained above, according to the present invention, the initial data (ROM data) can be written at the manufacturing process. Then, the initial data can be restored to write the initial data to the memory cell. Further, the data can be changed to any data by normal writing operation after manufacturing, and the initial data can be restored again.

What is claimed is:

1. A ferroelectric memory device comprising:
   a plurality of memory cells located at intersection between plural bit lines and plural word lines,
   wherein each of the plural memory cells includes a first memory cell comprising a ferroelectric capacitor having a first hysteresis characteristic and a second memory cell comprising a ferroelectric capacitor having a second hysteresis characteristic different from the first hysteresis,
   a first data is stored in the memory cells depending on the first and second hysteresis characteristics, and is read out according to the first and second hysteresis characteristics, and
   a second data is stored in the memory cells depending on a first and second polarization states of the hysteresis characteristic, and is read out according to the first and second polarization states.

2. The ferroelectric memory device according to claim 1, wherein the first hysteresis characteristic includes first polarization change to a change of a predetermined voltage or electric field applied to the ferroelectric capacitor, and the second hysteresis characteristic includes second polarization change larger than the first polarization change to the change of the predetermined voltage or electric field.

3. The ferroelectric memory device according to claim 1, wherein the ferroelectric capacitor having the first hysteresis characteristic has smaller capacity than the ferroelectric capacitor having the second hysteresis characteristic.

4. The ferroelectric memory device according to claim 1, wherein the ferroelectric capacitor having the first hysteresis characteristic has smaller dimension or larger thickness than the ferroelectric capacitor having the second hysteresis characteristic.

5. The ferroelectric memory device according to anyone of claims 1 to 4,
   wherein the memory cell having a cell transistor located between the bit line and the ferroelectric capacitor whose conductivity is controlled by the word line and
   said first data can be read out by making the ferroelectric capacitor be in a first polarization state according to the hysteresis characteristic by applying a first voltage or electric field to the ferroelectric capacitor, and making the ferroelectric capacitor be in the second polarizing state according to the hysteresis characteristic by changing the first voltage or electric field to a second voltage or electric field, while the ferroelectric capacitor is connected to the bit line, so that the potential of the bit line changes according to the change from the first polarizing state to the second polarizing state.

6. The ferroelectric memory device according to claim 5,
   wherein the ferroelectric capacitor is set to the corresponding polarizing state according to a potential of the bit line when the first data is read out so that the first data is written into the memory cell as the second data.

7. The ferroelectric memory device according to claim 5, further comprising:
   a reset circuit for driving the bit line pair to a predetermined potential to apply the first voltage or electric field to the ferroelectric capacitor before reading the first data; and
   a sense amplifier for detecting the charge of the potential of the bit line while the first polarizing state is changed to the second polarizing state thereby reading the first data.

8. The ferroelectric memory device according to any one of claims 1 to 4,
   wherein the bit line comprises a pair of bit lines, the memory cell includes a pair of cell transistors connected to the bit line pair and a pair of ferroelectric capacitors connected to the pair of cell transistors, the pair of ferroelectric capacitors having different hysteresis characteristic, and the predetermined data can be recorded by the combination of the hysteresis characteristic.

9. The ferroelectric memory device according to any one of claims 1 to 4,
   wherein the memory cell includes one cell transistor connected to the bit line and the ferroelectric capacitor connected to the cell transistor.

10. A ferroelectric memory device comprising:
    a plurality of memory cells located at intersection between plural bit lines and plural word lines, wherein each of the plural memory cells includes
    a first memory cell comprising a ferroelectric capacitor having a first hysteresis characteristic which includes first polarization change to a change of a predetermined voltage or electric field applied to the ferroelectric capacitor, and
    a second memory cell comprising a ferroelectric capacitor having a second hystersis characteristic which includes second polarization change larger than the first polarization change to the change of the predetermined voltage or electric field, a first data is stored in the memory cells depending on the first and second hysteresis characteristics, and is read out according to the first and second hysteresis characteristics, and a second data is stored in the memory cells depending on a first and second polarization states of the hysteresis characteristic, and is read out according to the first and second polarization states.

* * * * *